United States Patent
Minemura

(10) Patent No.: US 11,735,458 B2
(45) Date of Patent: Aug. 22, 2023

(54) CERAMIC MIXTURE PASTE, POROUS BODY, ELECTROSTATIC CHUCK, AND SUBSTRATE FIXING DEVICE

(71) Applicant: SHINKO ELECTRIC INDUSTRIES CO., LTD., Nagano (JP)

(72) Inventor: Tomotake Minemura, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 862 days.

(21) Appl. No.: 15/990,914

(22) Filed: May 29, 2018

(65) Prior Publication Data
US 2019/0035667 A1    Jan. 31, 2019

(30) Foreign Application Priority Data
Jul. 25, 2017  (JP) ................. 2017-143947

(51) Int. Cl.
*H01L 21/683* (2006.01)
*C04B 38/06* (2006.01)
(Continued)

(52) U.S. Cl.
CPC .......... *H01L 21/6833* (2013.01); *C04B 35/10* (2013.01); *C04B 35/111* (2013.01); *C04B 38/067* (2013.01); *C04B 38/0695* (2013.01); *H01L 21/6831* (2013.01); *H01L 21/68757* (2013.01); *C04B 2235/3206* (2013.01); *C04B 2235/3208* (2013.01); *C04B 2235/3217* (2013.01); *C04B 2235/3225* (2013.01); *C04B 2235/3418* (2013.01); *C04B 2235/5427* (2013.01); *C04B 2235/5436* (2013.01);
(Continued)

(58) Field of Classification Search
CPC ... C04B 35/10; C04B 38/067; C04B 38/0675; H01L 21/68757; H01L 21/6831; H01J 37/32715; H01J 2237/334
See application file for complete search history.

(56) References Cited

U.S. PATENT DOCUMENTS 6,606,234 B1 * 8/2003 Divakar .............. H01L 21/6833
361/234
7,396,586 B2 * 7/2008 Ohno .................... C04B 38/067
428/116
(Continued)

FOREIGN PATENT DOCUMENTS

JP    H10-264128    10/1998
JP    2003-075397    3/2003
(Continued)

OTHER PUBLICATIONS

English translation of JP 3933077 B2 (Year: 2007).*
(Continued)

*Primary Examiner* — Eric A. Gates
(74) *Attorney, Agent, or Firm* — IPUSA, PLLC

(57) ABSTRACT

A ceramic mixture paste includes oxide ceramic particles, burn-off particles, and a firing aid. The burn-off particles are burned off at a temperature lower than the firing temperature of the oxide ceramic particles. The firing aid melts at a temperature lower than the firing temperature. The ratio of the volume of the burn-off particles to the volume of the oxide ceramic particles is more than 0% and less than or equal to 20%.

6 Claims, 4 Drawing Sheets

(51) Int. Cl.
*C04B 35/10* (2006.01)
*H01L 21/687* (2006.01)
*C04B 35/111* (2006.01)
*H01J 37/32* (2006.01)

(52) U.S. Cl.
CPC .. *C04B 2235/77* (2013.01); *C04B 2235/9615* (2013.01); *H01J 37/32715* (2013.01); *H01J 2237/334* (2013.01)

(56) References Cited

U.S. PATENT DOCUMENTS

| | | | |
|---|---|---|---|
| 2007/0020155 A1 | 1/2007 | Ohno et al. | |
| 2007/0063453 A1* | 3/2007 | Ishikawa | B24B 37/30 279/3 |
| 2012/0003464 A1 | 1/2012 | Uoe et al. | |
| 2014/0189998 A1* | 7/2014 | Kusunose | H01L 21/6838 29/559 |
| 2015/0121824 A1* | 5/2015 | Jinbo | F01N 3/0222 55/523 |
| 2015/0279714 A1* | 10/2015 | Yamaguchi | H01L 21/6833 279/128 |
| 2017/0358476 A1* | 12/2017 | Horiuchi | H01L 21/67017 |

FOREIGN PATENT DOCUMENTS

| | | | | |
|---|---|---|---|---|
| JP | 2004-083371 | | 3/2004 | |
| JP | 2006019768 A | * | 1/2006 | |
| JP | 3933077 B2 | * | 6/2007 | ............... H01F 1/22 |
| JP | 2007-253144 | | 10/2007 | |
| JP | 2009-147384 | | 7/2009 | |
| JP | 2017-095339 | | 6/2017 | |
| TW | 201038507 | | 11/2010 | |

OTHER PUBLICATIONS

Office Action dated Jan. 26, 2021 issued with respect to the basic Japanese Patent Application No. 2017-143947.
Office Action dated Jun. 1, 2021 with respect to the corresponding Japanese Patent Application No. 2017-143947.
Office Action dated Jul. 30, 2021 with respect to the corresponding Taiwanese Patent Application No. 107118718.

* cited by examiner

CERAMIC MIXTURE PASTE, POROUS BODY, ELECTROSTATIC CHUCK, AND SUBSTRATE FIXING DEVICE

CROSS-REFERENCE TO RELATED APPLICATION

This application is based upon and claims the benefit of priority of the prior Japanese Patent Application No. 2017-143947, filed on Jul. 25, 2017, the entire contents of which are incorporated herein by reference.

FIELD

A certain aspect of the embodiments discussed herein is related to ceramic mixture pastes, porous bodies, electrostatic chucks, and substrate fixing devices.

BACKGROUND

Methods of manufacturing a ceramic porous body having an internal space have been known. For example, according to one of such methods, a ceramic porous body having an internal space is manufactured by placing a core of a desired shape at a desired position inside a ceramic powder compact and causing the core to disappear during the heating and firing of the compact. (See, for example, Japanese Laid-open Patent Publication No. 10-264128.)

SUMMARY

According to an aspect of the present invention, a ceramic mixture paste includes oxide ceramic particles, burn-off particles, and a firing aid. The burn-off particles are burned off at a temperature lower than the firing temperature of the oxide ceramic particles. The firing aid melts at a temperature lower than the firing temperature. The ratio of the volume of the burn-off particles to the volume of the oxide ceramic particles is more than 0% and less than or equal to 20%.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENT

Figure 1A:
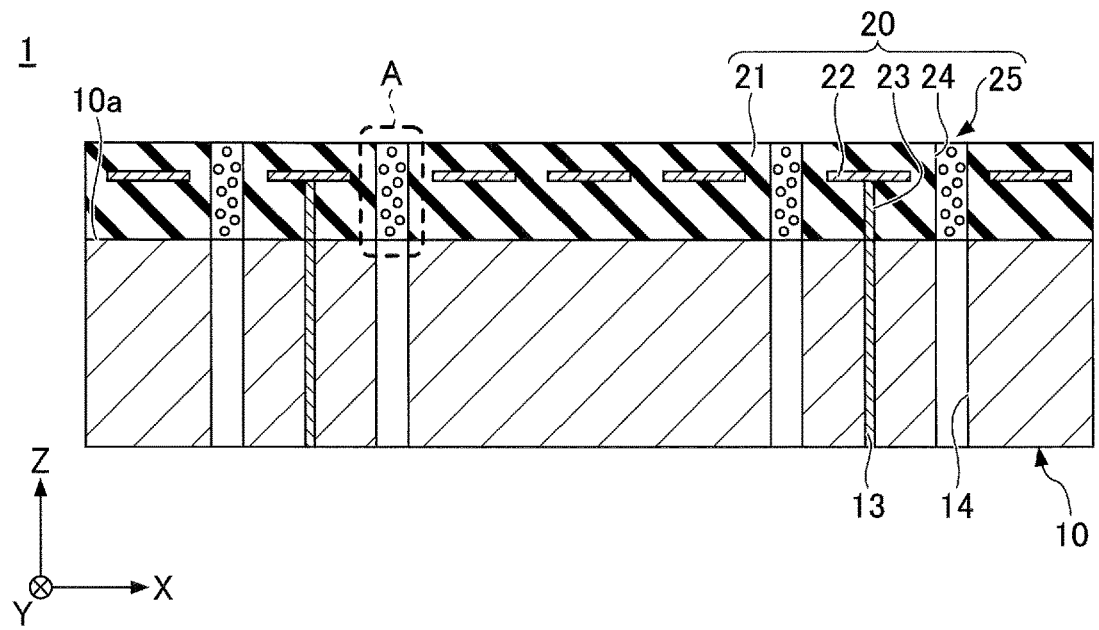
FIGS. 1A and 1B are schematic cross-sectional views of a substrate fixing device according to an embodiment.

According to the above-described conventional methods of manufacturing a ceramic porous body, however, no consideration is given to the rate of shrinkage of the compact due to heating (firing). Therefore, when in use, the porous body placed inside a through hole, for example, may fall off the through hole.

According to an aspect of the present invention, a ceramic mixture paste that can reduce the rate of shrinkage due to heating is provided.

One or more preferred embodiments of the present invention will be explained with reference to accompanying drawings. In the following description, the same element or component is referred to using the same reference numeral, and a repeated description thereof may be omitted.

Figure 1B:
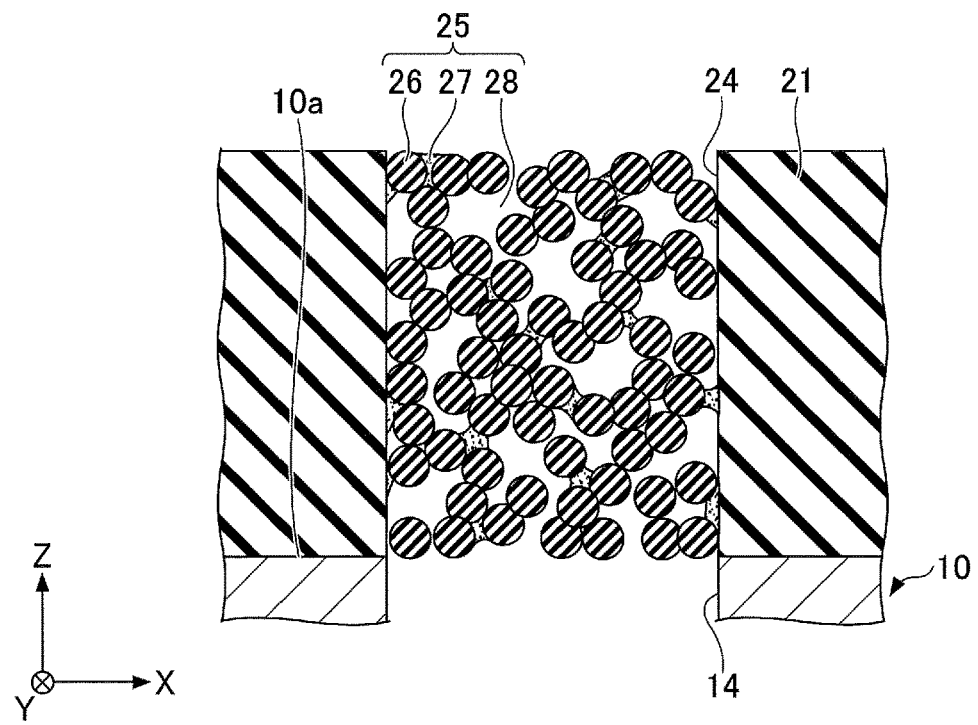

The structure of a substrate fixing device is described below. FIG. 1A is a schematic cross-sectional view of a substrate fixing device in its entirety according to an embodiment. FIG. 1B is an enlarged view of part A of FIG. 1A.

Referring to FIGS. 1A and 1B, a substrate fixing device 1 includes a baseplate 10 and an electrostatic chuck 20 provided on the baseplate 10 through, for example, an adhesive layer (not depicted).

In the following description, the substrate fixing device 1 is described using an XYZ coordinate system, which is a Cartesian coordinate system, as defined as illustrated in the drawings. For example, as illustrated in FIGS. 1A and 1B, an upper surface 10a of the baseplate 10 is an XY-plane surface, and the baseplate 10 and the electrostatic chuck 20 are stacked in the direction indicated by arrow Z (Z-direction), which is perpendicular to the XY plane. The Z-direction, which is the thickness direction of the substrate fixing device 1, may be referred to as "stacking direction." Directions perpendicular to the stacking direction (Z-direction) may be collectively referred to as "plane direction" (XY in-plane direction).

The baseplate 10 is a member for mounting the electrostatic chuck 20. The thickness of the baseplate 10 may be, for example, approximately 20 mm to approximately 50 mm. The baseplate 10 is formed of, for example, aluminum, and may also be used as, for example, an electrode for controlling plasma. By feeding the baseplate 10 with predetermined high-frequency electric power, it is possible to control energy for causing, for example, generated ions in the state of plasma to collide with a substrate (wafer) attracted onto the electrostatic chuck 20 to effectively perform etching.

Interconnects 13 are provided in the baseplate 10. The interconnects 13 are formed of, for example, copper, and are electrically insulated from the baseplate 10 by, for example, an insulating film.

Through holes 14 are provided in the baseplate 10 to pierce through the baseplate 10 in the Z-direction. The number of through holes 14 may be determined as desired. The through holes 14 form part of a gas passage through which an inert gas for cooling a substrate attracted onto the electrostatic chuck 20 is introduced. The planar shape of the through holes 14 is, for example, a circle, and the diameter of the through holes 14 may be, for example, approximately 1 mm to approximately 3 mm. The planar shape refers to the shape of an object viewed in a direction normal to the upper surface 10a of the baseplate 10 (for example, in the Z-direction).

A water conduit (not depicted) may be provided in the baseplate 10. By cooling the baseplate 10 by circulating cooling water through the water conduit provided in the baseplate 10, it is possible to cool a substrate attracted onto the electrostatic chuck 20.

The electrostatic chuck 20 includes a base (substrate) 21, an electrostatic electrode 22, interconnects 23, through holes 24, and a porous body 25. The electrostatic chuck 20 is, for example, a Johnsen-Rahbek electrostatic chuck. Alternatively, the electrostatic chuck 20 may be a Coulombic electrostatic chuck.

The base 21 is a dielectric. Suitable materials for the base 21 include, for example, ceramics such as aluminum oxide ($Al_2O_3$) and aluminum nitride (AlN). The thickness of the base 21 may be, for example, approximately 1 mm to approximately 10 mm. The relative permittivity (at 1 kHz) of the base 21 may be, for example, approximately 9 to approximately 10.

The electrostatic electrode 22 is a thin-film electrode buried in the base 21. The interconnects 23 have respective upper ends connected to the electrostatic electrode 22 and have respective lower ends exposed at the lower surface of the base 21 to be connected to the upper ends of the interconnects 13 provided in the baseplate 10. The electrostatic electrode 22 is connected to a power supply provided outside the substrate fixing device 1 through the interconnects 23 and 13. When a predetermined voltage is applied to the electrostatic electrode 22, an electrostatic attraction force is generated between the electrostatic electrode 22 and a substrate. As a result, the substrate can be attracted and held onto a placement surface of the base 21. The attraction and holding force increases as the voltage applied to the electrostatic electrode 22 increases. The electrostatic electrode 22 may have either a monopolar shape or a bipolar shape. Suitable materials for the electrostatic electrode 22 and the interconnects 23 include, for example, tungsten (W) and molybdenum (Mo).

The through holes 24 pierce through the base 21 in the Z-direction and communicate with the through holes 14 of the baseplate 10. The planar shape of the through holes 24 is, for example, a circle, and the diameter of the through holes 24 may be equal to the diameter of the through holes 14.

The porous body 25 includes a ceramic as its principal component, and is placed in the through holes 24. The porous body 25 includes multiple oxide ceramic particles 26, a firing aid 27, and pores 28.

Examples of oxide ceramic particles include substantially spherical aluminum oxide particles and zirconium oxide particles. The average particle size of the oxide ceramic particles 26 may be, for example, approximately 30 μm to approximately 500 μm. Here, the average particle size is the median value of a particle size distribution. Furthermore, the average particle size can be measured from, for example, an image captured by electron microscopic photography.

The firing aid 27 partly binds and unites outside surfaces of the oxide ceramic particles 26, and outside surfaces of the oxide ceramic particles 26 and the inner wall surfaces of the through holes 24. Examples of the firing aid 27 include a mixture of two or more oxides selected from aluminum oxide, silicon oxide, magnesium oxide, calcium oxide, yttrium oxide, etc.

The pores 28 are cavities in the through holes 24 where neither the oxide ceramic particles 26 nor the firing aid 27 is present. The porosity of the pores 28 formed in the through holes 24 is more than 30% and less than or equal to 43% of the overall volume of the porous body 25. Forming the pores 28 in the through holes 24 makes it possible to cause gas to pass through the through holes 24. That is, the pores 28 of the porous body 25 serve as a gas passage included in the base 21.

Thus, a gas passage through which an inert gas for cooling a substrate attracted onto the electrostatic chuck 20 is introduced from outside the baseplate 10 can be formed by the through holes 14 of the baseplate 10 and the pores 28 of the porous body 25 provided in the through holes 24. Examples of the inert gas include helium gas.

The base 21 may include a heating element (not depicted). When a voltage is applied to the heating element from outside the substrate fixing device 1, the heating element generates heat and heats the placement surface of the base 21 to a predetermined temperature. The heating element can heat the placement surface of the base 21 up to, for example, approximately 250° C. to approximately 300° C. Suitable materials for the heating element include, for example, copper (Cu), tungsten (W), and nickel (Ni).

Next, a method of manufacturing a substrate fixing device according to this embodiment is described. FIGS. 2A through 2F are diagrams illustrating a process of manufacturing a substrate fixing device according to this embodiment.

Figure 2A:
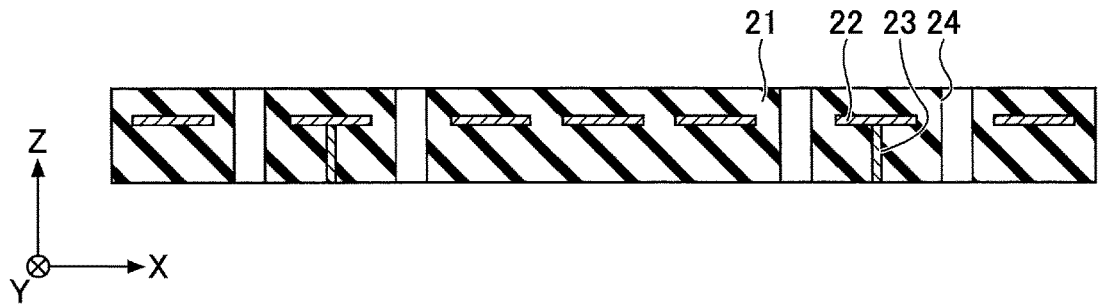
FIGS. 2A through 2F are diagrams illustrating a process of manufacturing a substrate fixing device according to the embodiment.

First, in the process depicted in FIG. 2A, the base 21 including the electrostatic electrode 22 and the interconnects 23 is formed, and the through holes 24 are formed in the base 21. The base 21 may be formed by, for example, placing a material that becomes the electrostatic electrode 22 and the interconnects 23 in a green sheet that becomes the base 21 and firing the green sheet. The through holes 24 may be formed by drilling or laser processing. The through holes 24 formed by drilling or laser processing have a smooth inner wall surface.

Figure 2B:
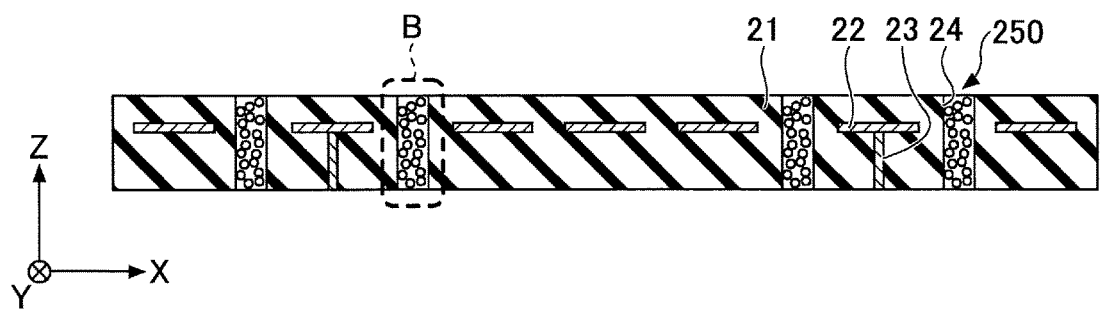
Figure 2C:
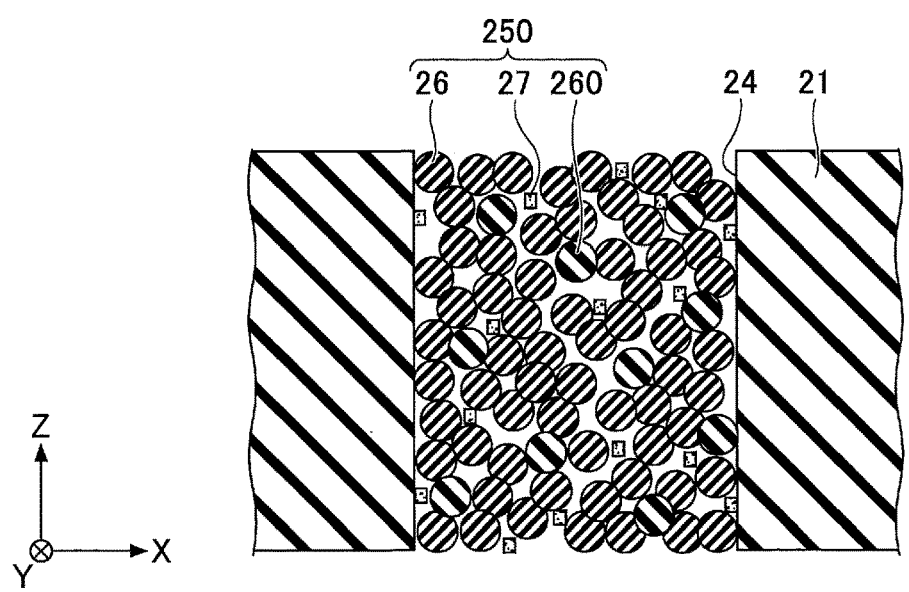

Next, in the process depicted in FIGS. 2B and 2C, the through holes 24 are filled with a ceramic mixture 250 in paste form serving as a precursor to the porous body 25. FIG. 2C is an enlarged view of part B of FIG. 2B.

The ceramic mixture 250 is a mixture of at least the oxide ceramic particles 26, the firing aid 27, and burn-off particles 260. The oxide ceramic particles 26, the firing aid 27, and the burn-off particles 260 are not bound. One or more substances other than the oxide ceramic particles 26, the firing aid 27, and the burn-off particles 260, such as an organic binder and a solvent, may be mixed in the ceramic mixture 250.

The burn-off particles 260 are particles to be burned off (to be burned and disappear) (at a temperature lower than the firing temperature of the oxide ceramic particles 26) during the firing of the oxide ceramic particles 26. The burn-off particles 260 are preferably substantially spherical particles having an average particle size greater than the average particle size of the oxide ceramic particles 26. This is because if the burn-off particles 260 have an average particle size smaller than the average particle size of the oxide ceramic particles 26, there may be a burn-off particle 260 that is placed in a gap between adjacent oxide ceramic particles 26, and in this case, no contribution can be made to improvement in the porosity.

Furthermore, the ratio of the volume of the burn-off particles 260 to the volume of the oxide ceramic particles 26 is preferably more than 0% and less than or equal to 20%. The reason for this is described below. In the case of using aluminum oxide particles as the oxide ceramic particles 26, for example, polymethyl methacrylate (PMMA) particles may be used as the burn-off particles 260.

The firing aid 27 is a substance that melts (at a temperature lower than the firing temperature of the oxide ceramic particles 26) and thereafter hardens during the firing of the oxide ceramic particles 26 to bind outside surfaces of the oxide ceramic particles 26, and outside surfaces of the oxide ceramic particles 26 and the inner wall surfaces of the through holes 24.

The through holes 24 can be filled with the ceramic mixture 250 using, for example, a squeegee after closing the lower ends of the through holes 24 by placing the structure of FIG. 2A on a sheet-shaped member, for example. The upper end of the ceramic mixture 250 filling in the through holes 24 may protrude from the upper surface of the base 21.

Figure 2D:
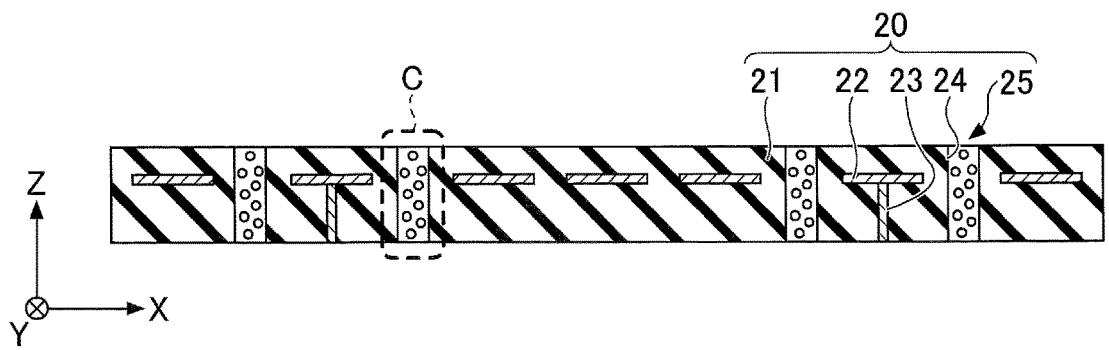
Figure 2E:
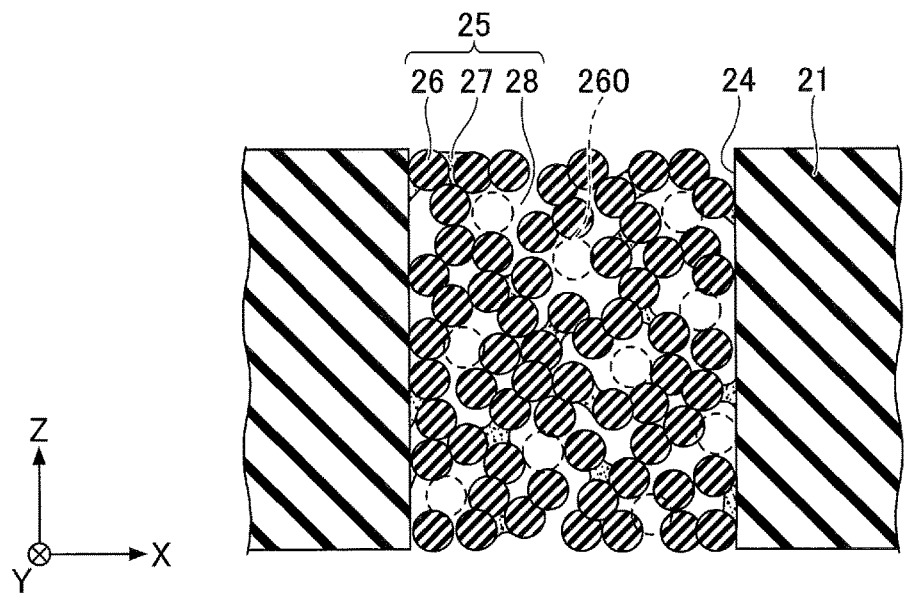

Next, in the process depicted in FIGS. 2D and 2E, the ceramic mixture 250 is heated to a predetermined temperature at which the oxide ceramic particles 26 can be fired (the firing temperature of the oxide ceramic particles 26) to form the porous body 25 in the through holes 24. By heating the ceramic mixture 250 to the predetermined temperature, it is possible to fire the oxide ceramic particles 26 and burn and remove the burn-off particles 260. FIG. 2E is an enlarged view of part C of FIG. 2D.

The burn-off particles 260 are burned off, so that a region in which the burn-off particles 260 are present before firing becomes part of the pores 28. Furthermore, the firing aid 27 melts and thereafter hardens to partly bind and unite outside surfaces of the oxide ceramic particles 26, and outside surfaces of the oxide ceramic particles 26 and the inner wall surfaces of the through holes 24. The porosity of the pores 28 formed in the through holes 24 is more than 30% and less than or equal to 43% of the overall volume of the porous body 25. Furthermore, the rate of shrinkage of the porous body 25 relative to the ceramic mixture 250 (the ratio of a change in volume between before and after firing) is 1% or less.

Referring to FIG. 2E, the region in which the burn-off particles 260 are present before firing, which is indicated by a dashed line for clarity, is part of the pores 28. When the upper end of the porous body 25 protrudes from the upper surface of the base 21, the protruding portion of the porous body 25 is polished away. As a result, the upper end of the porous body 25 exposed in the through holes 24 can be flush with the upper surface of the base 21. The lower end of the porous body 25 may be polished on an as-needed basis. By this process, the electrostatic chuck 20 is completed.

Figure 2F:
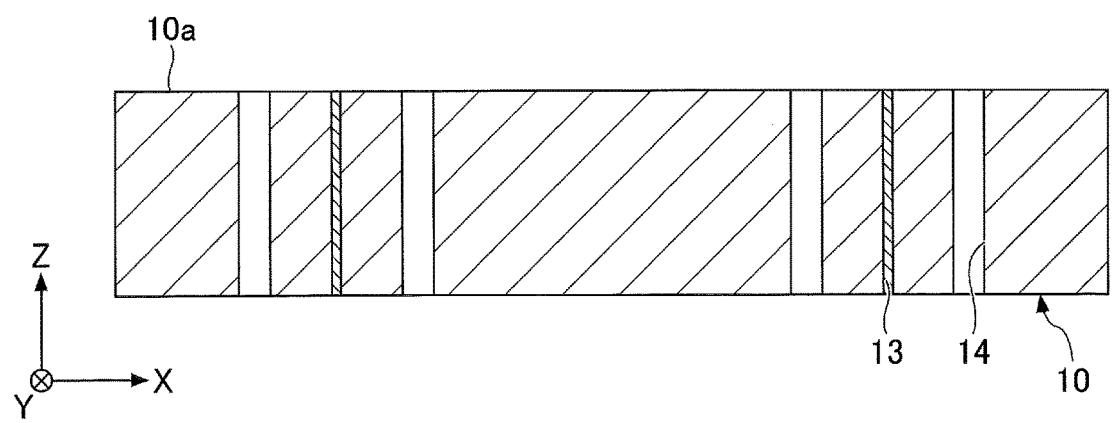

Next, in the process depicted in FIG. 2F, the baseplate 10, in which the interconnects 13 and the through holes 14 are provided, is prepared. After the process depicted in FIG. 2F, for example, a silicone adhesive is applied onto the upper surface 10a of the baseplate 10, the electrostatic chuck 20 is placed over the baseplate 10 so that the through holes 14 of the baseplate 10 communicate with the through holes 24 of the electrostatic chuck 20, and the silicone adhesive is cured. Furthermore, the upper ends of the interconnects 13 and the lower ends of the interconnects 23 are connected by, for example, soldering. As a result, the substrate fixing device 1 illustrated in FIGS. 1A and 1B is completed.

Here, a description is given of the relationship among the rate of shrinkage of the porous body 25 relative to the ceramic mixture 250 (hereinafter referred to as "shrinkage rate S"), the ratio of the volume of the burn-off particles 260 to the volume of the oxide ceramic particles 26 (hereinafter referred to as "volume ratio V"), and the porosity of the pores 28 formed in the through holes 24 (hereinafter referred to as "porosity P").

The shrinkage rate S is preferably 1% or less. This is because a shrinkage rate S of 1% or less makes it possible to prevent the porous body 25 from falling off the through holes 24.

The inventor studied the relationship between the volume ratio V and the shrinkage rate S to find out that while the shrinkage rate S more often exceeds 1% when the volume ratio V is approximately 30%, it is possible to ensure that the shrinkage rate S is 1% or less when the volume ratio V is 20% or less.

Figure 3:
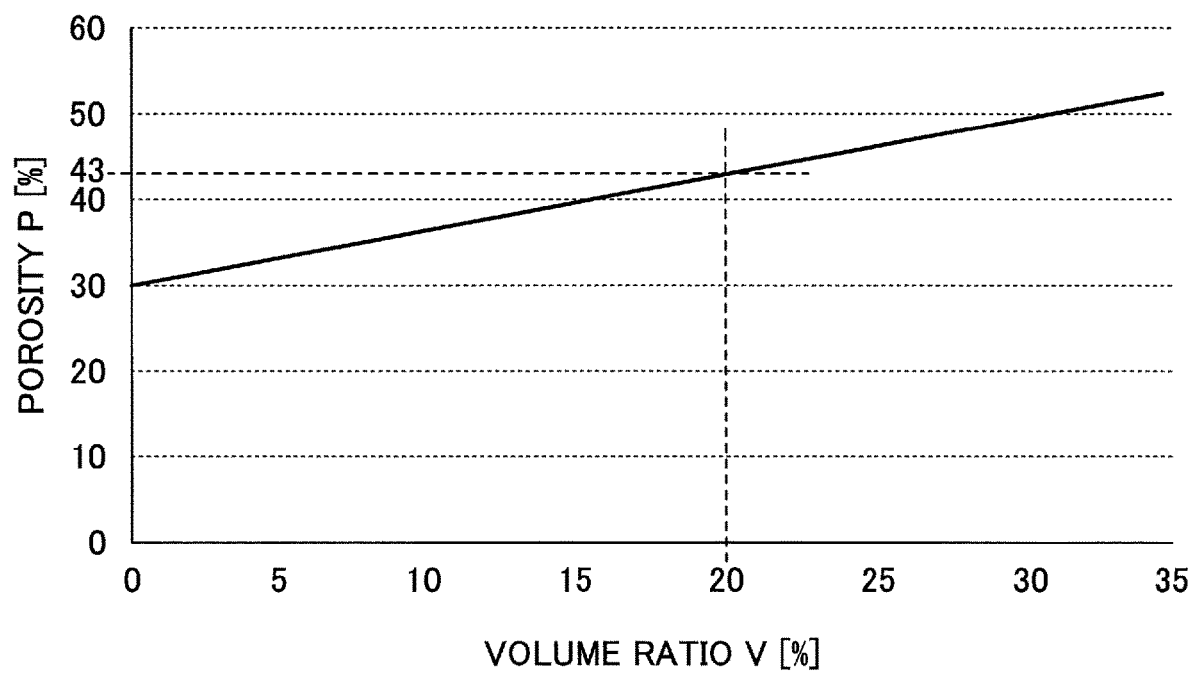
FIG. 3 is a graph illustrating the relationship between a volume ratio V and a porosity P.

The inventor then studied the relationship between the volume ratio V and the porosity P. Letting the volume of the oxide ceramic particles 26, the volume of a firing aid, the volume of the burn-off particles 260, and the volume of pores in the case of adding no burn-off particles 260 be V1, V2, V3 and VP, respectively, the porosity P is given by $P=(V3+VP)/(V1+V2+VP)$, and the result of FIG. 3 was obtained. FIG. 3 indicates that the porosity P is 43% when the volume ratio V is 20%. At this point, it is assumed that none of the burn-off particles 260 is placed between adjacent oxide ceramic particles 26.

That is, to have a shrinkage rate S of 1% or less, it is necessary to have a volume ratio V of 20% or less, and by having a volume ratio V of 20% or less, it is possible to achieve the porous body 25 whose porosity P is up to 43%. Furthermore, by adjusting the volume ratio V to any value less than or equal to 20%, it is possible to have a shrinkage rate S of 1% or less and to achieve a desired value of the porosity P (up to 43%).

In the electrostatic chuck 20 of the substrate fixing device 1, the porous body 25 provided in the through holes 24 forms a gas passage. Therefore, when the substrate fixing device 1 is applied to a plasma apparatus, unlike in the case where the inner wall surfaces of the through holes 24 are exposed, it is possible to prevent abnormal plasma discharge. That is, according to the substrate fixing device 1, it is possible to control abnormal plasma discharge and to introduce an inert gas for cooling a substrate attracted onto the electrostatic chuck 20 through the porous body 25.

Furthermore, according to the substrate fixing device 1, because the shrinkage rate S is 1% or less, the porous body 25 does not fall off the through holes 24. Furthermore, by adjusting the volume ratio V to any value less than or equal to 20%, it is possible to achieve a desired value of the porosity P (up to 43%). Therefore, it is possible to supply a substrate attracted onto the electrostatic chuck 20 with a sufficient amount of inert gas through the porous body 25.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, examples of substrates to be attracted and adhered to a substrate fixing device according to embodiments of the present invention may include, in addition to wafers (semiconductor wafers such as silicon wafers), glass substrates used in the process of manufacturing, for example, liquid crystal panels.

Furthermore, a porous body according to embodiments of the present invention may be used for not only electrostatic chucks but also, for example, gas- or liquid-permeable filters.

Various aspects of the subject-matter described herein may be set out non-exhaustively in the following numbered clauses:

1. A method of manufacturing a porous body including a ceramic as a principal component, the method including:

forming a ceramic mixture paste into which oxide ceramic particles, burn-off particles that are burned off at a temperature lower than a firing temperature of the oxide ceramic particles, and a firing aid that melts at a temperature lower than the firing temperature are mixed; and heating the ceramic mixture paste to a predetermined temperature to fire the oxide ceramic particles and burn off the burn-off particles, wherein a ratio of a volume of the burn-off particles to a volume of the oxide ceramic particles is more than 0% and less than or equal to 20% in forming the ceramic mixture paste.

2. The method of clause 1, wherein
the oxide ceramic particles are aluminum oxide particles, and
the burn-off particles are polymethyl methacrylate particles.

3. A method of manufacturing an electrostatic chuck, the electrostatic chuck including a base configured to attract and hold a substrate, the method including:

forming a through hole in a dielectric to become the base;

forming a ceramic mixture paste into which oxide ceramic particles, burn-off particles that are burned off at a temperature lower than a firing temperature of the oxide ceramic particles, and a firing aid that melts at a temperature lower than the firing temperature are mixed; and forming a porous body in the through hole by filling the through hole with the ceramic mixture paste and thereafter heating the ceramic mixture paste to a predetermined temperature to fire the oxide ceramic particles and burn off the burn-off particles, the porous body including pores that form a gas passage, wherein a ratio of a volume of the burn-off particles to a volume of the oxide ceramic particles is more than 0% and less than or equal to 20% in forming the ceramic mixture paste.

4. The method of clause 3, wherein the porous body has a porosity of more than 30% and less than or equal to 43%.

What is claimed is:

1. A ceramic mixture paste comprising:
oxide ceramic particles;
burn-off particles that are burned off at a temperature lower than a firing temperature of the oxide ceramic particles; and a firing aid that melts at a temperature lower than the firing temperature, wherein the oxide ceramic particles, the burn-off particles, and the firing aid are mixed in paste form, and a ratio of a volume of the burn-off particles to a volume of the oxide ceramic particles is more than 0% and less than or equal to 20%.

2. The ceramic mixture paste as claimed in claim 1, wherein an average particle size of the burn-off particles is greater than an average particle size of the oxide ceramic particles.

3. The ceramic mixture paste as claimed in claim 1, wherein
the oxide ceramic particles are aluminum oxide particles, and
the burn-off particles are polymethyl methacrylate particles.

4. A porous body comprising:
oxide ceramic particles; and
a firing aid binding the oxide ceramic particles,
wherein a porosity of the porous body is more than 30% and less than or equal to 43%.

5. An electrostatic chuck comprising:
a base including a through hole, the base being configured to attract and hold a substrate; and
a porous body in the through hole, the porous body including spherical oxide ceramic particles as a principal component, the porous body including pores that form a gas passage, the porous body having a porosity of more than 30% and less than or equal to 43%,
wherein an average size of the pores is greater than an average size of the spherical oxide ceramic particles.

6. A substrate fixing device comprising:
a baseplate; and
the electrostatic chuck as set forth in claim 5, the electrostatic chuck being on the baseplate.

* * * * *